(12) United States Patent
Yan et al.

(10) Patent No.: US 8,604,409 B2
(45) Date of Patent: Dec. 10, 2013

(54) PHOTOSENSITIVE DETECTOR WITH COMPOSITE DIELECTRIC GATE MOSFET STRUCTURE AND ITS SIGNAL READOUT METHOD

(75) Inventors: Feng Yan, Jiangsu (CN); Rong Zhang, Jiangsu (CN); Yi Shi, Jiangsu (CN); Lin Pu, Jiangsu (CN); Yue Xu, Jiangsu (CN); Fuwei Wu, Jiangsu (CN); Xiaofeng Bo, Jiangsu (CN); Haoguang Xia, Jiangsu (CN)

(73) Assignees: Nanjing University, Nanjing, Jiangsu (CN); Feng Yan, Nanjing, Jiangsu (CN)

( * ) Notice: Subject to any disclaimer, the term of this patent is extended or adjusted under 35 U.S.C. 154(b) by 301 days.

(21) Appl. No.: 13/126,079

(22) PCT Filed: Feb. 10, 2010

(86) PCT No.: PCT/CN2010/070612
§ 371 (c)(1),
(2), (4) Date: Apr. 26, 2011

(87) PCT Pub. No.: WO2010/094233
PCT Pub. Date: Aug. 26, 2010

(65) Prior Publication Data
US 2011/0215227 A1  Sep. 8, 2011

(30) Foreign Application Priority Data

Feb. 18, 2009 (CN) .......................... 2009 1 0024504
Apr. 15, 2009 (CN) .......................... 2009 1 0030729
Nov. 18, 2009 (CN) .......................... 2009 1 0234266

(51) Int. Cl.
*H01L 31/00* (2006.01)
(52) U.S. Cl.
USPC .................................. 250/214.1; 250/214 R

(58) Field of Classification Search
USPC ........ 250/214 R, 214.1, 214 A, 214 LA, 239, 250/216; 257/311–318, 66–71; 438/201, 438/211, 257–262, 296
See application file for complete search history.

(56) References Cited

U.S. PATENT DOCUMENTS

| | | |
|---|---|---|
| 4,893,273 A | 1/1990 | Usami |
| 5,147,811 A | 9/1992 | Sakagami |
| 6,348,378 B1 | 2/2002 | Lee |
| 6,772,992 B1 * | 8/2004 | Lombardo et al. ............ 257/315 |
| 6,784,933 B1 | 8/2004 | Nakai |

FOREIGN PATENT DOCUMENTS

WO PCT/CN2010/070612      5/2010

* cited by examiner

*Primary Examiner* — Que T Le
(74) *Attorney, Agent, or Firm* — Global IP Services; Tianhua Gu

(57) ABSTRACT

The present invention relates to a photosensitive detector with a composite dielectric gate MOSFET structure and its signal readout method. The MOSFET structure detector is formed on a p-type semiconductor substrate. N-type semiconductor regions locate on the two sides of the top part of the p-type semiconductor substrate to form a source and a drain. An underlying dielectric layer, a photo-electron storage layer, a top dielectric layer, and a control gate are stacked on the substrate in sequence. The top insulating dielectric layer can prevent the photoelectrons stored in the photo-electron storage layer from leaking into the control gate. The source and the drain are floating when photoelectrons are collected and injected into the photoelectron storing layer to be held therein. There is a transparent or semi-transparent window for detecting incident light forming on the substrate or gate surface. This invented detector has excellent scalability, basic compatibility with the flash memory fabricating technology, low leakage current, higher imaging speed than CCD, non-sensitivity to processing defects, larger dynamic range than other structures and higher accuracy of signal readout.

14 Claims, 8 Drawing Sheets

PHOTOSENSITIVE DETECTOR WITH COMPOSITE DIELECTRIC GATE MOSFET STRUCTURE AND ITS SIGNAL READOUT METHOD

CROSS REFERENCE TO RELATED PATENT APPLICATION

The present application is the U.S. national stage of PCT/CN2010/070612 filed on Feb. 10, 2010, which claims the priority of the Chinese patent applications No. 200910024504.6 filed on Feb. 18, 2009, No. 200910030729.2 filed on Apr. 15, 2009 and No. 200910234266.1 filed on Nov. 18, 2009, which applications are incorporated herein by reference.

FIELD OF THE INVENTION

The present invention relates to an imaging detector working at infrared, visible light and ultraviolet band, mainly includes its structure, working principle and signal readout method. The invention describes a kind of photosensitive detector with a composite dielectric gate MOSFET structure and its signal readout method.

BACKGROUND OF THE INVENTION

Currently, CCD and CMOS-APS are the mainstream imaging detectors. The basic working principle of CCD is similar to the physical mechanism of metal-oxide-semiconductor (MOS) capacitor. CCD is consisted of MOS capacitors and its working process includes signal charge generation, storage, transmission and detection. CCD is a device which transfers and stores signal in the form of charge packet. Its outstanding feature is that CCD transfers charge signal, instead of voltage signal or current signal, which is different from other imaging devices. When CCD is employed, clock pulse changes the semiconductor potential, which dictates the storage and transfer of charges. As for CMOS-APS, its work mechanism is described in Chinese patent CN1774814.

The technical parameters of a typical visible light CCD imaging device are as follows.

| | | |
|---|---|---|
| Maximum pixel density | 10k × 10k | (DALSA) |
| Minimum pixel size | 2.4 μm | (e2V) can't be reduced. |
| Well capacity | 1000 e$^-$/μm$^2$ | |

The technical parameters of a typical CMOS-APS imaging device (The functions of CMOS-APS pixel unit include photoelectron collection, storage, amplification, reset, and address selection.) are as follows.

| | | |
|---|---|---|
| Maximum pixel density | 4k × 4k | (0.18 μm CMOS process, Raytheon etc.) |
| Minimum pixel size | 2.8 μm | (0.25 CMOS process, Panasonic) hard to be reduced. |
| Well capacity | 3000 e$^-$/μm$^2$ | |

A general comparison of CCD and CMOS-APS

| | CCD | CMOS-APS |
|---|---|---|
| Leakage current | Perfect <1 nA/cm$^2$ | Worse >50 nA/cm$^2$ |
| Fill factor | Perfect ~100% | Worse <60% |
| Process requirement | High | General |
| Yield | Low | High |
| Compatible with CMOS Process or not | No | Yes |

The limitations of CCD and CMOS-APS:

Presently, CCD and CMOS-APS are widely used as imaging devices in scientific instruments and home imaging equipments, but they both have their shortcomings which cannot be resolved. Essentially, CCD is made of a large number of MOS capacitors in series, which can transfer charges directionally in parallel. Its limitations are as follows.

1) It is difficult to increase the imaging speed as CCD needs to transfer charges physically during imaging.
2) The yield is low. Because of the cascaded structure of MOS capacitors and the need of transferring charges, any failed MOS capacitor among a string of CCD pixel units can affect the transmission of charge and the following pixel units cannot work normally. It usually shows the black stripe, white bars or filament. Therefore, process requirement for CCD manufacturing is very high, which usually leads to the low yield and high production cost.
3) It is difficult to reduce the size of pixel unit further. To maintain the same signal to noise rate (SNR) during the charges' transmission, the scaling of the size of the pixel unit demands thinner oxide nitride (ON) and the quality of ON should not change. Therefore, the further scaling of the size of pixel unit is very difficult. In addition, the edge effect also limits the further scaling of the pixel unit.

All of the limitations mentioned above are the essential problems of CCD, which can't be resolved fundamentally. The process factors of CCD manufacturing have significant effects on CCD. CCD is manufactured in the silicon integrated circuits and the basic processes include cleaning, oxidation, diffusion, lithography, etch, implantation, LPCVD, plasma growth and the test for each process step. The process of CCD manufacturing is the combination of above single process in different numbers and orders. Oxidation is one of the key processes and the SiO$_2$ film formed by oxidation has very important effects on CCD. The SiO$_2$ film is used as 1) the protection and passivation film of CCD, 2) the gate dielectric and 3) isolated layer between polysilicon films. The SiO$_2$ can prevent the short circuit between the top and bottom polysilicon. The oxide should have no pinholes and voids. CCD manufacturing usually uses an oxidization method with a recombination of wet oxygen and dry oxygen oxidization method. In CCD manufacturing technology, the gate dielectric is made of SiO$_2$ film and Si$_3$N$_4$ film above SiO$_2$. This is because the dielectric constant of Si$_3$N$_4$ is about twice that of SiO$_2$, but the thermal expansion coefficient of Si$_3$N$_4$ is twice that of SiO$_2$ which leads to the bad contact of Si$_3$N$_4$ and Si. The expansion coefficient of SiO$_2$ is close to that of Si, so CCD uses SiO$_2$/Si$_3$N$_4$ as dielectric. Nowadays scientists all over the world are studying the gate dielectric of MOSFETs. They try to use high dielectric constant material instead of SiO$_2$. These materials include: IIIA and IIIB group metallic oxide, such as Al$_2$O$_3$, Y$_2$O$_3$ and La$_2$O$_3$; VIB group metallic oxide, such as HfO$_2$, ZrO$_2$, TiO$_2$; stacked structure such as HfO$_2$/SiO$_2$ and ZrO$_2$/SiO$_2$.

Unlike CCD, the pixel unit of CMOS-APS is independent with each other. During the signal transmission it doesn't need to transfer the charge, as a consequence it overcomes the shortcomings of CCD fundamentally. But each pixel of CMOS-APS is made of one photosensitive diode and three or more transistors. This framework leads to the following questions. 1) high dark current: because CMOS-APS use one diode as the photosensitive device, the dark current is almost two order of magnitudes higher than that of CCD; (2) difficult to improve the equivalent quantum efficiency; (3) unlike CCD, the pixel of CMOS-APS has at least three transistors besides the photosensitive diode, the fill factor of CMOS-APS is less than 60%. The ideal imaging device should have the advantages of pixel unit of CCD and the framework of CMOS-APS, which is also the purpose of this invention.

The existing floating gate memory device is a MOS device with an additional gate added between channel and control gate, this gate is surrounded by oxide so it is called floating gate. There is a control gate over the floating gate and this structure refers to the Chinese patent CN1156337. Under a certain electric field, electrons can tunnel into the floating gate surrounded by dense oxide. The advance of floating gate memory is as follows. Embedding Ge nanocrystals in the high-k dielectric can enhance the reliability, reduce the write voltage and increase the program speed; additionally, it can also improve the storage characteristics; MIS structure is made with electron beam evaporation method, it includes Al control gate, Ge nanocrystals in $Al_2O_3$ and $Al_2O_3$ tunneling oxide layer. This MIS structure shows good electrical properties under 1 MHz C-V test. The flat-band shift is up to 0.96V and charge storage density is $4.17 \times 10^{12}$ cm$^{-2}$. The charge storage properties of Ge nanocrystals in $Al_2O_3$ vary with frequency, the flat-band shift and charge storage density decrease with the increasing frequency (refers to Chinese Journal of Functional Materials and Devices, vol. 02, 2007).

SUMMARY OF THE INVENTION

The Purpose of the Invention

This invention proposes a new detector structure and its working principles, especially a new photosensitive detector with composite dielectric gate MOSFET structure and its signal readout method. The detection range includes infrared and ultraviolet wavelength.

The Technical Scheme of the Invention

A photosensitive detector with a composite dielectric gate MOSFET structure comprising: n-type semiconductor regions (2) located on the two sides of the top part of the p-type semiconductor substrate (1) to form a source and a drain; an underlying dielectric layer (5), a photoelectron storage layer (8), a top dielectric layer (6), and a control gate (7) stacked on the substrate in sequence. The described photoelectron storage layer (8) can be polysilicon, $Si_3N_4$, InGaN, metal film or other electronic conductors and semiconductors; the control gate (7) can be polysilicon, metal or transparent conducting electrode.

The second i.e. the top dielectric layer (6) that is connected to the control gate (7) prevents the photoelectrons stored in the photoelectron storage layer from leaking into the control gate. Under low gate voltage, the first dielectric layer (5) connected to the p substrate (1) effectively shields the channel between the source and the drain from the photoelectron storage layer (8). If the gate voltage or photon energy is high enough, the electrons in the channel can be injected into the photoelectron storage layer (8). While photoelectrons are collected and injected, the source and the drain should be floating.

The first i.e. the bottom dielectric layer (5) is made of silicon oxide, SiON or other materials with high-k dielectrics; the second i.e. the top dielectric layer (6) is made of $SiO_2$/$Si_3N_4$/$SiO_2$, $SiO_2$/$Al_2O_3$/$SiO_2$, $SiO_2$, $Al_2O_3$ or other materials with high-k dielectrics.

When the voltage difference between the gate and the substrate is high enough, the photoelectrons collected in the channel can tunnel into the photoelectron storage layer (8). At least one of the substrate or the gate surface must be transparent or semitransparent for detecting the wavelength.

The signal readout method of the detector with composite dielectric gate structure described above, namely the steps of photoelectron readout, amplification and reset:

Photoelectron Readout and Amplification:

Ground the gate and the substrate, and apply a proper positive voltage on the drain. Regulate the gate voltage to ensure that the MOSFET detector work in the linear region. By directly measuring and comparing the output drain current before and after exposure to light, the optical signal strength can be determined.

The relationship between the drain current change and the number of collected photoelectrons is as follows:

$$\Delta I_{DS} = \frac{\mu_n C_{ox} W}{L} \cdot \frac{N_{FG} q}{C_T} \cdot V_{DS} \quad (a)$$

Where $\Delta I_{DS}$ is the detector drain current change before and after exposure, $N_{FG}$ is the number of photoelectrons in the photoelectron storage layer, $C_T$ is the total equivalent capacitance of the photoelectron storage layer, $C_{ox}$ is the gate oxide capacitance per unit area between photoelectron storage layer and the substrate, W and L are the detector channel width and length respectively, $\mu_n$ is the electron mobility, $V_{DS}$ is the drain to source voltage.

Reset:

The gate is applied a negative voltage and the substrate is grounded. If the negative voltage is high enough, the photoelectrons in the photoelectron storage layer will tunnel into the p-type substrate.

The photoelectron storage layer (8) applies a split structure; the top dielectric (6) isolates the photoelectron storage layer from the source and the drain; the control gate (7) is above the top dielectric, there are insulating side walls (9) on two sides of control gate, the substrate or the gate surface must be transparent or semitransparent for detecting the wavelength.

Wherein said both the source and the drain regions close to the channel are enclosed by heavily doped p-type pockets (3); n-type LDD regions (4) as the extension of the source and the drain locate on the two sides of channel.

Wherein said readings of the number of photoelectrons are taken before and after exposure in order to accurately record the number of collected photoelectrons.

Before exposure, apply two different control gate voltage $V_{CG1}$ and $V_{CG2}$ respectively, and then measure the drain current $I_{DS1}$ and $I_{DS2}$, the transconductance before exposure can be obtained:

$$\beta_1^{CG} = \frac{C_{CG}}{C_T} \cdot \frac{C_{ox} \mu_n W}{L} = \frac{\Delta I_{DS}}{\Delta V_{CG} \cdot V_{DS}} \quad (b)$$

Where, $\mu_n$ is the electron mobility before exposure, $C_{CG}$ is the top dielectric layer capacitance, $V_{DS}$ is the drain to source voltage. $\Delta V_{CG} = V_{CG2} - V_{CG1}$, $\Delta I_{DS} = I_{DS2} - I_{DS1}$.

After exposure, in order to compensate the electron mobility drift, also apply two different control gate voltages $V_{CG1}$ and $V_{CG2}$ respectively, and then measure the drain current $I^*_{DS1}$ and $I^*_{DS2}$, the transconductance after exposure can be obtained:

$$\beta_2^{CG} = \frac{\Delta I^*_{DS}}{\Delta V_{CG} \cdot V_{DS}} = \frac{C_{CG}}{C_T} \cdot \frac{C_{ox}\mu_n^* W}{L} \quad (c)$$

Where, $\mu^*_n$ is the electron mobility after exposure, $\Delta V_{CG}=V_{CG2}-V_{CG1}$, $\Delta I^*_{DS}=I^*_{DS2}-I^*_{DS1}$. Finally, the charge number change before and after exposure in the charge storage layer can be obtained in term of drain current $I_{DS1}$ and $I^*_{DS1}$ under gate voltage $V_{CG1}$.

$$\Delta Q_{FG} = \left( \frac{I^*_{DS1}}{\beta_2^{CG} \cdot V_{DS}} - \frac{I_{DS1}}{\beta_1^{CG} \cdot V_{DS}} \right) \cdot C_{CG} \quad (d)$$

The number of collected photoelectrons after exposure can be obtained accurately from eq. (d). As a result, the error caused by electron mobility shift can be compensated.

Wherein said the method for signal readout, including the collection and storage of photoelectrons before the signal is read out and amplified:

If a positive pulse voltage is applied on the gate, an electron depletion region is generated in the p-type substrate. When the incident photons are absorbed in the depletion region, photoelectrons will be generated. Driven by the gate voltage, the photoelectrons drift to the interface between channel and bottom insulating layer. Increasing the gate voltage and when it is high enough, the photoelectrons will tunnel into the photoelectron storage layer by F—N tunneling mechanism; if the photon energy is higher than the conduction band energy difference $\Delta E_c$ between substrate semiconductor and bottom insulating layer, the photoelectrons will directly tunnel into the electron storage layer. While collecting photoelectrons, the source and drain should be floating to prevent the electrons from tunneling into the storage layer. After the collected photoelectrons are stored in storage layer, the threshold voltage of the detector will shift, i.e. the drain current changes. By measuring the drain current change before and after exposure, the photoelectron number in the storage layer can be obtained.

Wherein said the first i.e. the bottom dielectric material (5) uses $SiO_2$ 1-10 nm, $Si_3N_4$ 1-10 nm, $HfO_2$, $Al_2O_3$, $ZrO_2$, $Y_2O_3$, $BaTiO_3$, $ZrSiO_4$ or $Ta_2O_3$, their equivalent oxide thickness 1-10 nm or AlGaN 1-100 nm.

The second i.e. the top dielectric material (6) uses $SiO_2/Si_3N_4/SiO_2$, its equivalent oxide thickness 12-20 nm; $SiO_2/Al_2O_3/SiO_2$, its equivalent oxide thickness 10-100 nm; $HfO_2$, $Al_2O_3$, $ZrO_2$, $Y_2O_3$, $BaTiO_3$, $ZrSiO_4$ or $Ta_2O_3$, their equivalent oxide thickness 12-20 nm or AlGaN 1-100 nm.

The photoelectron storage layer material (8) uses polysilicon 10-200 nm, $Si_3N_4$ 3-10 nm, AlGaN 10-200 nm.

The control gate material (7) uses polysilicon 10-200 nm, ITO 3-10 nm, metal or transparent electrode.

Wherein said the units of the detector array is comprised of composite dielectric gate MOSFET.

Wherein said the first i.e. the bottom insulating dielectric uses $SiO_2$ 1-10 nm; the second i.e. the top insulating dielectric uses $SiO_2/Si_3N_4/SiO_2$ or $SiO_2/Al_2O_3/SiO_2$, its equivalent oxide thickness 12-20 nm, photoelectron storage layer material uses polysilicon 10-200 nm, the control gate material uses polysilicon.

Wherein said the first i.e. the bottom insulating dielectric uses $SiO_2$ 1-10 nm; the second i.e. the top insulating dielectric uses $SiO_2$ 10-20 nm, the photoelectron storage layer material uses $Si_3N_4$ 10-20 nm, the control gate material uses polysilicon.

Wherein said the control gate uses tungsten, the top insulating dielectric uses $Al_2O_3$ 10 nm, the photoelectron storage layer material uses $Si_3N_4$ 3-10 nm, the bottom insulating dielectric uses SiO2 1-10 nm.

Wherein said the control gate uses polysilicon, the top insulating dielectric uses $SiO_2$ 10-20 nm, the photoelectron storage layer material uses polysilicon 1-200 nm, the bottom insulating dielectric uses high-k dielectric material, its equivalent $SiO_2$ thickness of 1-5 nm.

Wherein said the control gate uses metal, the top insulating dielectric uses $SiO_2$ 10-100 nm, the photoelectron storage layer material uses InGaN 10-200 nm, the bottom insulating dielectric uses AlGaN 1-100 nm, the substrate material uses AlGaN.

The detector unit of the invention adopts composite dielectric gate MOSFET structure and it is used as a pixel which has the functions of photoelectron collection, address selection, signal readout and reset. The detector units are arranged to form a detector array, i.e. a photosensitive detector with composite dielectric gate structure.

This invention proposes a detector using composite dielectric gate MOSFET and its optical signal processing method, the array of this device can forms a high resolution imaging chip. Therefore, the detector or imaging chip using MOSFETs with other structures, materials and parameters are within the content of this invention.

The advantages of the photosensitive detector with composite dielectric gate MOSFET structure are as follows, compared with CCD and CMOS-APS, the photosensitive detector with composite dielectric gate MOSFET structure has many advantages of CCD and CMOS-APS, but also overcomes many shortcomings of them, it is the ideal selection of next generation imaging device. Its features and advantages are as follows.

Excellent Scalability:

The size of present composite dielectric gate MOSFET in flash technology is about 4-10 $F^2$ (F is the minimum scale of lithography). Under 45 nm lithography technology, the area of a photosensitive detector with composite dielectric gate MOSFET structure is as small as 0.02 $\mu m^2$ i.e. there are about 50 photosensitive detectors within 1 $\mu m^2$. By contrast, the minimum size of one CCD pixel is about 2×2 $\mu m^2$ while 1×1 $\mu m^2$ for CMOS-APS. When the composite dielectric gate MOSFET continues scaling down, the resolution of photosensitive detector with composite dielectric gate MOSFET structure will increase further.

Table 1 shows the area of photosensitive detector with composite dielectric gate MOSFET structure under different process technology. Now the minimum resolution of photographic film is about 0.1 $\mu m$. So, when the photosensitive detector with composite dielectric gate MOSFET structure further scales down, it will provide a resolution that CCD and CMOS-APS can't achieve. The electronic imaging quality of photosensitive detector with composite dielectric gate MOSFET structure will achieve or exceed that of photographic film and physical resolution will be higher than the optical resolution.

TABLE 1 the feature parameters of photosensitive detector
with composite dielectric gate MOSFET structure.

| Minimum feature size(μm) | 0.5 | 0.25 | 0.18 | 0.13 | 0.09 | 0.065 | 0.045 |
|---|---|---|---|---|---|---|---|
| Pixel area(μm$^2$) | 2.5 | 0.625 | 0.324 | 0.169 | 0.081 | 0.04225 | 0.02025 |
| Resolution enhancement factor(compared with 2×2 μm$^2$ CCD pixel) | 1.6 | 6.4 | 12.3 | 23.7 | 49.4 | 94.7 | 197.5 |

Note:
The pixel area size of detector with composite dielectric gate MOSFET structure in table 1 is counted by 10F$^2$ Compatibility with Flash Memory Technology:

The process of photosensitive detector with composite dielectric gate structure is the same as that of standard composite dielectric gate MOSFET. The photosensitive detector with composite dielectric gate structure can be produced through slightly adjusting the standard composite dielectric gate MOSFET process.

Low Leakage Current:

The detection mechanism of photosensitive detector with composite dielectric gate MOSFET structure is the same with CCD, so the leakage current is 1-2 orders of magnitude lower than that of CMOS-APS which uses a photosensitive diode.

Higher Imaging Speed than CCD:

Although it has similar photoelectron collection mechanism to CCD, photosensitive detector with composite dielectric gate MOSFET structure stores the generated photoelectrons in the photoelectron storage layer instead of the channel. Through measuring the threshold voltage (i.e. the charges number in the charge storage layer), the signal can be read out. It doesn't need to transfer photoelectrons like CCD, therefore its imaging speed is the same with that of CMOS-APS and is higher than that of CCD.

Non-Sensitivity to Process Defects:

Because photosensitive detector with composite dielectric gate MOSFET structure doesn't need to transfer photoelectrons, the failure of any one pixel doesn't affect other pixels, thus photosensitive detector is not sensitive to process defects and fit for fabricating large area detector array. It can be used to form various array structures like NOR or NAND.

Larger Dynamic Range than Other Structures:

Because the signal readout process doesn't affect the stored photoelectron number, photosensitive detector supports the signal readout many times.

In practice, the output signal can be regulated by changing the control gate voltage, so the dynamic range of output signal can be expanded using different control gate voltage. That is the advantage that CCD and CMOS-APS doesn't have.

Higher Accuracy of Signal Readout:

The photosensitive detector of the invention adopts the twice signal readout method before and after exposure respectively to identify electric signal quantity exactly, i.e. by measuring the drain current under same bias before and after exposure, the charge variation in the photoelectron storage layer can be obtained and the number of collected photoelectrons can be read out accurately, which can compensate the variance of gate oxide trap and interface trap density. Additionally, as the manufacturing process of detector with composite dielectric gate MOSFET structure is compatible with flash technology, this process allows some memory cells fabricated on a chip. Some prepared images can be stored in the memory cells for the automation pattern recognition. In star tracker, this function can be adopted to help the system positioning automatically without additional pattern recognition function. Moreover, we can also store needful matched image in the flash memory manufactured with photosensitive detector at the same time, which can realize on-chip topographic matching function.

DETAILED DESCRIPTION OF THE INVENTION

Figure 1:
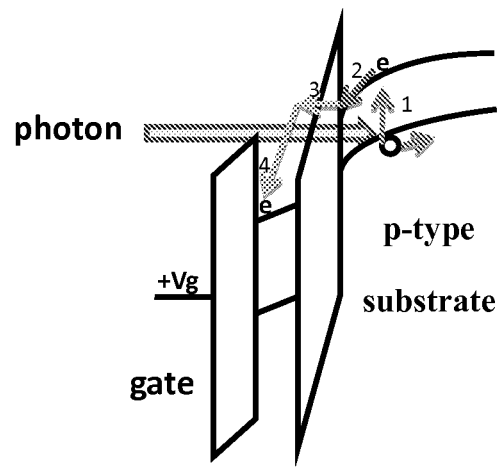
FIG. 1 is a diagram of energy band, photoelectrons generation and transfer for the detector described in this invention.
Figure 2:
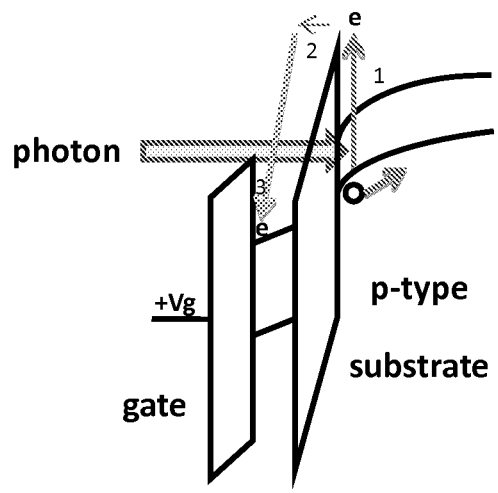
FIG. 2 is another diagram of energy band, photoelectrons generation and transfer for the detector described in this invention.

The Working Mechanism and Procedure of the Photoelectrons Storage Layer are as Follows:

1) Photoelectron Collection and Signal Acquisition:

Refer to the diagram of the energy band and photoelectrons generation and transfer in FIG. 1 and FIG. 2.

1. Photoelectron generation. If photon hv>semiconductor E$_g$ (or E$_g$+ΔE$_c$), photon will be absorbed by semiconductor, then electrons can be excited from valence band to conduction band.

2. Photoelectron transfer. If the gate voltage is higher than substrate voltage, the photoelectron will transfer to the interface between substrate and bottom dielectric. If the voltage difference between gate and substrate is positive voltage and photon hv>semiconductor $E_g+\Delta E_c$, the excited photoelectrons can enter photoelectron storage layer directly.

3. Photoelectron tunneling. The Photoelectron can tunnel into the photoelectron storage layer when the electric field in bottom dielectric is high enough.

4. Photoelectron storage. If the electric field in top dielectric is relatively low, the photoelectron can be stored in the storage layer.

FIG. 1 and FIG. 2 illustrate the structure of composite dielectric gate MOSFET and the photoelectron collecting principle. The action of photoelectron in the storage layer (such as polysilicon) is identical to CCD completely. The difference is that CCD stores photoelectrons in channel while composite dielectric gate MOSFET stores photoelectrons in the storage layer. There are three mechanisms for photoelectrons tunneling into storage layer. (1) Photoelectrons move into the channel and then tunnel directly into the composite dielectric gate. (2) Photoelectrons tunnel into the composite dielectric gate by FN mechanism, just like the programming mechanism of flash memory. (3) Photoelectrons directly emit into composite dielectric gate just like PMT. The difference is that PMT emit electron into vacuum while the described detector emits electrons into composite dielectric gate. It is noted that source and drain have to be kept floating during photoelectron collection to prevent electron injecting from source or drain terminal. In addition, the photoelectron collection process and injection process can be separated. Therefore, lower voltage can be used during collection phase to reduce the dark current.

The detector unit of this invention adopts composite dielectric gate structure and it is used as a pixel which has the functions of photoelectron collection, address selection, signal readout and reset. The detector units are arranged to form a detector array, i.e. a photosensitive detector with composite dielectric gate structure.

The Photoelectron collection, Storage, Readout and Amplification of the Described Detector:

The structure of each pixel unit of the new detector with composite dielectric gate MOSFET structure is as follows, n-type regions locate on two sides of the top part of the p-type semiconductor substrate to form source and drain, above the top of the p substrate are two dielectric layers with one photoelectron storage layer between them. The steps of photoelectron readout and amplification of the described detector are as follows.

By directly measuring and comparing the output drain current before and after exposure to light respectively, the optical signal strength can be determined.

The relationship between the drain current change and the number of collected photoelectrons is as follows:

$$\Delta I_{DS} = \frac{\mu_n C_{ox} W}{L} \cdot \frac{N_{FG} q}{C_T} \cdot V_{DS} \quad (a)$$

Where $\Delta I_{DS}$ is the detector drain current change before and after exposure to light, $N_{FG}$ is the number of photoelectron in the photoelectron storage layer, $C_T$ is the total equivalent capacitance of the detector, $C_{ox}$ is the gate oxide capacitance per unit area between photoelectron storage layer and the substrate, W and L are the detector channel width and length respectively, $\mu_n$ is the electron mobility, $V_{DS}$ is the drain to source voltage.

Reset:

The detector gate is applied a negative voltage and the substrate is grounded. If the negative voltage is high enough, the photoelectrons in the photoelectron storage layer will tunnel back to the p-type substrate.

Figure 4:
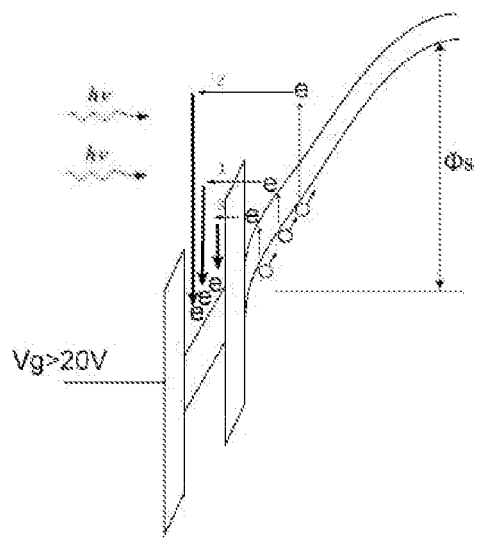
FIG. 4 is a diagrammatic sectional view illustrating an embodiment of the second dielectric layer consisted of SiO$_2$/Si$_3$N$_4$/SiO$_2$ in the invented detector.

The Photoelectron Collection and Storage:

If the gate is applied a positive pulse voltage, a depletion region is generated in the p-type substrate. When the photons incident on the depletion region are absorbed, then photoelectrons are generated. The photoelectrons drift to the interface of channel and bottom dielectric under gate voltage. Increasing the gate voltage and when it is high enough, the photoelectrons tunnel into the photoelectron storage layer by F—N tunneling mechanism; if the photon energy is higher than the conduction band energy difference $\Delta Ec$ between substrate semiconductor and bottom dielectric, the photoelectrons will directly tunnel into the electron storage layer. The specific process is illustrated in FIG. 4, process 1 shows that photoelectrons on the channel surface tunnel into storage layer through the bottom dielectric by FN tunneling mechanism, process 2 shows that photoelectrons on the channel surface tunnel into storage layer through the bottom dielectric by direct tunneling mechanism. During collecting the photoelectrons, the source and drain should be floating to prevent the electrons tunneling into the storage layer from them. When the electric field in the second dielectric is low, photoelectrons will be stored in the storage layer. After the collected photoelectrons stored in the storage layer, the threshold voltage of the detector will shift, namely the drain current will change. Thus by measuring the drain current change before and after exposure to light, the photoelectron number in the storage layer can be obtained.

The Signal Readout and Amplification:

Ground the gate and source, and apply a proper positive voltage $V_D$ on the drain to make the MOSFET detector work in the linear region by regulating the gate voltage $V_G$. By measuring the drain current change before and after exposure to light, the number of photoelectron in the storage layer can be obtained. But during photoelectron collection and storage, photoelectrons tunnel into the storage layer through bottom dielectric such as $SiO_2$. Photoelectrons with high energy can degrade $SiO_2$. As a result, Si—O bond is broken down and traps are generated which can become fixed charge after capturing electrons. At the same time, interface states are generated between P substrate and $SiO_2$. The mobility will change due to scatter effect when the photoelectrons quickly move nearby the fixed charge and interface states. If using the method of comparing the two drain current before and after exposure to obtain the number of photoelectron, i.e. directly adopting the method illustrated in equation (a), the obtained number of photoelectron may be inaccurate due to neglecting the shift of mobility. In order to compensate the mobility shift and read out the photoelectron number accurately, the method of reading twice before and after exposure to light is used. Before exposure to light, apply two different voltage $V_{CG1}$ and $V_{CG2}$ on control gate respectively, and then measure the drain current $I_{DS1}$ and $I_{DS2}$, the transconductance $\beta_1^{CG}$ before exposure to light can be obtained; After exposure, in order to compensate the electron mobility drift, similarly, apply two different voltage $V_{CG1}$ and $V_{CG2}$ on control gate respectively, and then measure the drain current $I^*_{DS1}$ and $I^*_{DS2}$, the transconductance $\beta_2^{CG}$ after exposure to light can be obtained; Finally, the charge number change before and after exposure in the charge storage layer i.e. the number of collected photoelectron can be obtained by using drain current $I_{DS1}$ and $I^*_{DS1}$ under gate voltage $V_{CG1}$. Therefore, the error caused by electron mobility shift for the one time readout method can be compensated Similarly, ground the source and substrate, and apply a proper positive voltage $V_D$ on the drain to ensure the MOSFET detector work in the sub-threshold region by regulating the gate voltage $V_G$. In order to compensate the discrepancy of trapped charge density in $SiO_2$ and the interface states before and after exposure to light, the number of collected charge can be obtained by reading out twice before and after exposure respectively.

Reset:

The detector gate is applied a negative voltage and the substrate is grounded. If the negative voltage is high enough, the photoelectrons in the photoelectron storage layer will tunnel into the p-type substrate.

Detailed description is as follows:

[1]. The Detector Working in Linear Region

Ground the gate and source, and apply a proper positive voltage $V_D$ on the drain to make the MOSFET detector work in the linear region by regulating the gate voltage $V_G$. By directly measuring and comparing the output drain current before and after exposure respectively, the optical signal strength can be determined. The relationship between drain current change and the number of collected photoelectron is as follows $$\Delta I_{DS} = \frac{\mu_n C_{ox} W}{L} \cdot \frac{N_{FG} q}{C_T} \cdot V_{DS} \qquad (a)$$

In order to compensate the mobility $\mu_n$ shift, and read out the number of collected photoelectron accurately, the method of reading out twice before and after exposure respectively is used. When the detector works in linear region, the expression of output drain current is $$I_{DS} = \beta^{CG}\left(V_{CG} - V_T^{CG} + \frac{Q_{FG}}{C_{CG}}\right) V_{DS} \qquad (a\text{-}1)$$

Where $\beta^{CG}$ is the transconductance of the detector, $V_{CG}$ is the control gate voltage, $V_T^{CG}$ is the threshold voltage of the detector, $Q_{CG}$ is the charge quantity stored in storage layer, $C_{CG}$ is the equivalent capacitance between gate and photo-electron storage layer.

Before exposure to light, apply two different voltages $V_{CG1}$ and $V_{CG2}$ on control gate respectively, and then measure the drain current $I_{DS1}$ and $I_{DS2}$, the transconductance before exposure can be obtained:

$$\beta_1^{CG} = \frac{C_{CG}}{C_T} \cdot \frac{C_{ox} \mu_n W}{L} = \frac{\Delta I_{DS}}{\Delta V_{CG} \cdot V_{DS}} \qquad (b)$$

Where, $\mu_n$ is the mobility before exposure to light, $C_{CG}$ is the top dielectric capacitance, $C_T$ is the total equivalent capacitance of photoelectron storage layer, $C_{ox}$ is the bottom dielectric capacitance per unit area. $\Delta V_{CG} = V_{CG2} - V_{CG1}$, $\Delta I_{DS} = I D_{DS2} - I_{DS1}$.

After exposure to light, in order to compensate the electron mobility drift, apply two different voltages $V_{CG1}$ and $V_{CG2}$ on control gate respectively, and then measure the drain current $I^*_{DS1}$ and $I^*_{DS2}$, the transconductance after exposure can be obtained:

$$\beta_2^{CG} = \frac{\Delta I^*_{DS}}{\Delta V_{CG} \cdot V_{DS}} = \frac{C_{CG}}{C_T} \cdot \frac{C_{ox} \mu_n^* W}{L} \qquad (c)$$

Where, $\mu_n^*$ is the electron mobility after exposure, $\Delta V_{CG} = V_{CG2} - V_{CG1}$, $\Delta I^*_{DS} = I^*_{DS2} - I^*_{DS}$. Finally, the charge number change before and after exposure in the charge storage layer can be obtained by using drain current $I_{DS1}$ and $I^*_{DS1}$ under gate voltage $V_{CG1}$.

$$\Delta Q_{FG} = \left(\frac{I^*_{DS1}}{\beta_2^{CG} \cdot V_{DS}} - \frac{I_{DS1}}{\beta_1^{CG} \cdot V_{DS}}\right) \cdot C_{CG} \qquad (d)$$

Using equation (b), (c) and (d), the number of collected photoelectron after exposure can be read out accurately, the error caused by the electron mobility shift can be compensated.

[2]. The Detector Working in Sub-Threshold Region

Apply a proper positive voltage $V_D$ on the drain to ensure the MOSFET detector work in the sub-threshold region by regulating the gate voltage $V_G$. If meeting $V_{DS} \gg KT/q$, the drain current is $$I_{DS} = I_{D0} \exp\left(\frac{q\left(V_{GS} - V_T + \frac{Q_{FG}}{C_{CG}}\right)}{nKT}\right) \qquad (e)$$

Where, $I_{D0}$ depends on the device size, temperature and substrate doping concentration. $I_{D0}$ is constant under certain temperature after manufacture. $n = 1 + (C_B + C_{it})/C_{ox}$, $C_B$ is substrate capacitance per unit area which is proportional to the square root of substrate doping concentration; $C_{it}$ is the capacitance per unit area induced by traps which is proportional to interface states and oxide trap density.

The oxide trap density and the interface states density are non-uniform before and after the photoelectrons are stored, which cause the change of n value in equation (e). So it is inaccurate to obtain the collected photoelectron number in storage layer by directly comparing the drain current before and after exposure. In order to compensate the effect induced by the non-uniform of traps and interface states density, twice readout (before and after exposure) method is also used to obtain the number of collected photoelectron in sub-threshold region.

Before exposure to light, apply two different voltage $V_{CG1}$ and $V_{CG2}$ on control gate respectively, and then measure the corresponding drain current $I_{DS1}$ and $I_{DS2}$, the factor n before exposure can be obtained:

$$n = \frac{q}{KT} \cdot \frac{\Delta V_{CG}}{\ln \frac{I_{DS2}}{I_{DS1}}} \qquad (f)$$

After exposure to light, apply two different voltages $V_{CG1}$ and $V_{CG2}$ on control gate respectively, and then measure the corresponding drain current $I^*_{DS1}$ and $I^*_{DS2}$, the factor n* after exposure can be obtained:

$$n^* = \frac{q}{KT} \cdot \frac{\Delta V_{CG}}{\ln \frac{I^*_{DS2}}{I^*_{DS1}}} \quad (g)$$

Finally, the charge number change in the charge storage layer before and after exposure can be obtained by using drain current $I^*_{DS1}$ and $I_{DS1}$ under gate voltage $V_{CG1}$.

$$\Delta Q_{FG} = \left[ n^* \frac{KT}{q} \ln \frac{I^*_{DS1}}{I_{D0}} - n \frac{KT}{q} \ln \frac{I_{DS1}}{I_{D0}} \right] C_{CG} \quad (h)$$

Using equation (h), the number of collected photoelectron can be read out accurately and the effect of non-uniformity induced by the oxide traps and interface states before and after exposure can be resolved.

Meanwhile, it should be noted that under 0.18 μm, 0.13 μm or smaller process, the short channel effect seriously affect the exact readout number of photoelectron. Therefore, another method of twice readout (before and after exposure to light) is proposed to compensate the error that caused by the short channel effect, dielectric traps and interface states.

The traps are generated during photoelectron storage and reset. But the traps generated in bottom dielectric during one working cycle are negligible. In order to exactly obtain the electron mobility before the device begin to work each time, two different voltage can be applied on gate before exposure, two different voltage are also applied after exposure to minimize the influence of short channel effect.

When the detector is working in linear region, the output drain current is $$I_{DS} = \beta^{CG} V_{DS} \frac{V_{CG} - V_T^{CG} - \frac{1}{2} V_{DS}}{1 + \theta \left( V_{CG} - V_T^{CG} - \frac{1}{2} V_{DS} \right)} \quad (i)$$

Where $\beta^{CG}$ the transconductance, $V_{CG}$ is gate control voltage, $V_T^{CG}$ is the threshold voltage, $\theta$ depends on the parameter of process.

Before exposure to light, in order to reduce the influence induced by the traps generated in the bottom dielectric on electron mobility, applying two different voltages $V_{CG1}$ and $V_{CG2}$ on control gate respectively, and then measuring the corresponding drain current $I^*_{DS1}$ and $I^*_{DS2}$, the transconductance before exposure can be obtained.

$$\sqrt{\beta_1^{CG}} = \frac{I_{DS1}}{\sqrt{V_{DS}} \left( V_{CG1} - V_T^{CG} - \frac{1}{2} V_{DS} \right)} \sqrt{\frac{\Delta V_{CG}}{\Delta I_{DS}}} \quad (j)$$

Where $\Delta V_{CG} = V_{CG2} - V_{CG1} \ll V_{CG1}$, $\Delta I_{DS} = I_{DS2} - I_{DS1}$.

After exposure, in order to compensate the short channel effect, applying two different voltage $V_{CG1}$ and $V_{CG2}$ on control gate respectively, and then measuring the corresponding drain current $I^*_{DS1}$ and $I^*_{DS2}$, the transconductance can be obtained.

$$\sqrt{\beta_2^{CG}} = \frac{I^*_{DS1}}{\sqrt{V_{DS}} \left( V_{CG1} - V_T^{CG} + \frac{Q}{C_{CG}} - \frac{1}{2} V_{DS} \right)} \sqrt{\frac{\Delta V_{CG}}{\Delta I^*_{DS}}} \quad (k)$$

Where, Q is the collected photoelectron number in the storage layer, $C^{CG}$ is the equivalent capacitance between gate and photoelectron storage layer, $\Delta V_{CG} = V_{CG} = V_{CG2} - V_{CG1} \ll V_{CG1}$, $\Delta I^*_{DS} = I^*_{DS2} - I^*_{DS1}$.

Finally, the charge number change before and after exposure in the charge storage layer can be obtained by using drain current $I_{DS1}$ and $I^*_{DS1}$ under gate voltage $V_{CG1}$.

$$Q = \left( \frac{I^*_{DS1}}{I_{DS1}} \sqrt{\frac{\Delta I_{DS}}{\Delta I^*_{DS}}} - 1 \right) \left( V_{CG1} - V_T^{CG} - \frac{1}{2} V_{DS} \right) \cdot C_{CG} \quad (l)$$

The number of collected photoelectron can be read out accurately using equation (1), and the error induced by the short channel effect and electron mobility shift can be resolved.

3) Reset

Figure 9:
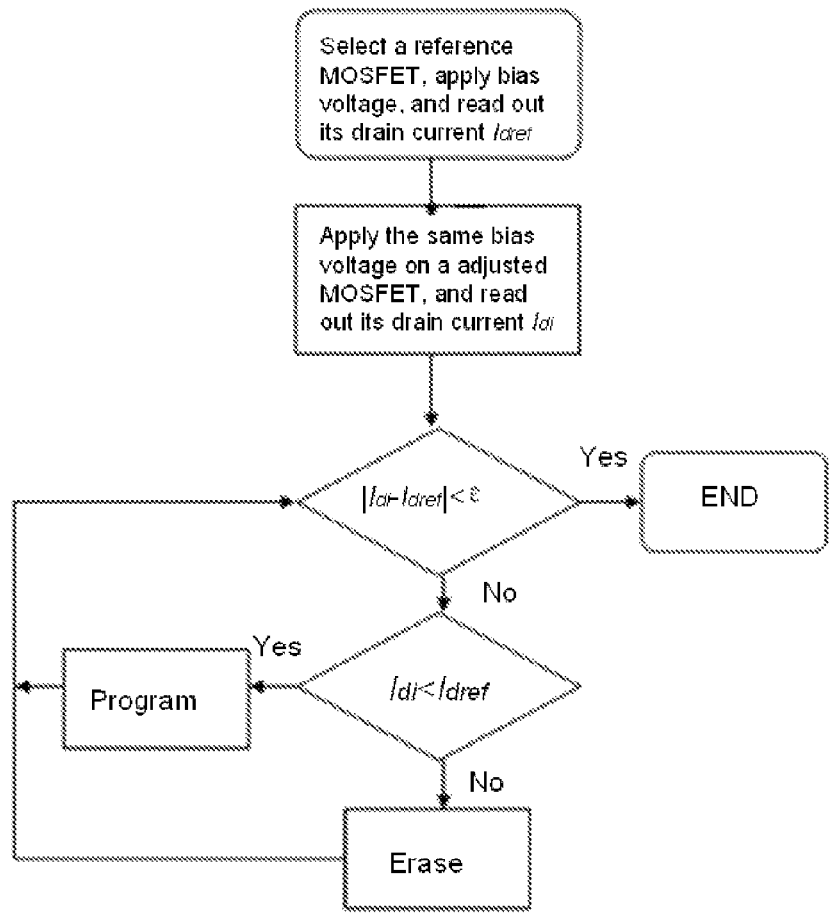
FIG. 9 is a diagram illustrating the reset flow of the invented detector.

Apply a negative voltage $V_g$ on gate and ground the substrate, then increase the negative voltage $V_g$, photoelectrons tunnel out of storage layer or holes tunnel into the storage layer. Thus, the detector can be reset using this method. In application, allowing for the over-erase problem, the threshold voltage can be modulated combining with programming. FIG. 9 illustrates the detailed reset steps. Selecting a MOSFET with threshold value $V_{tref}$ as the reference, applying a gate-voltage and drain-voltage and then measuring the drain current $I_{dref}$. Apply the same voltage on another device to make it reset and measure the drain current $I_{di}$. Set ∈ as the max current deviation between $I_{di}$ and $I_{dref}$. If current deviation is smaller than ∈, the reset of the detector is completed, if not, the threshold can be modulated to a proper value by erase and write.

4) The detector units in this invention can be arranged to form a detector array with composite dielectric gate MOSFET with present flash memory process.

Figure 7:
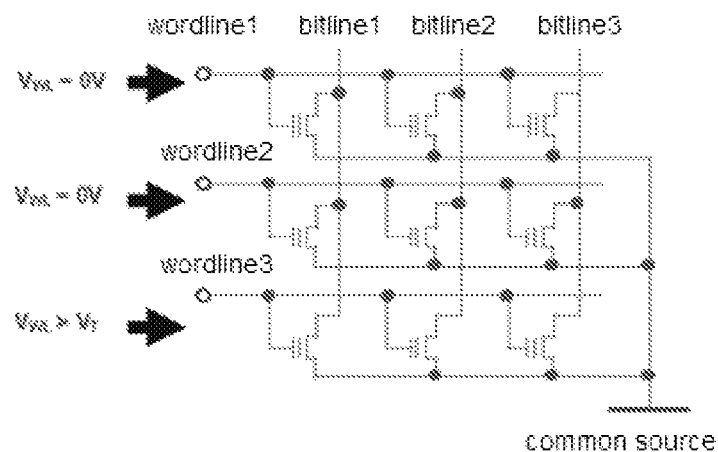
FIG. 7 is diagram illustrating the turn-on state of three photosensitive detector units in one bit line.
Figure 8:
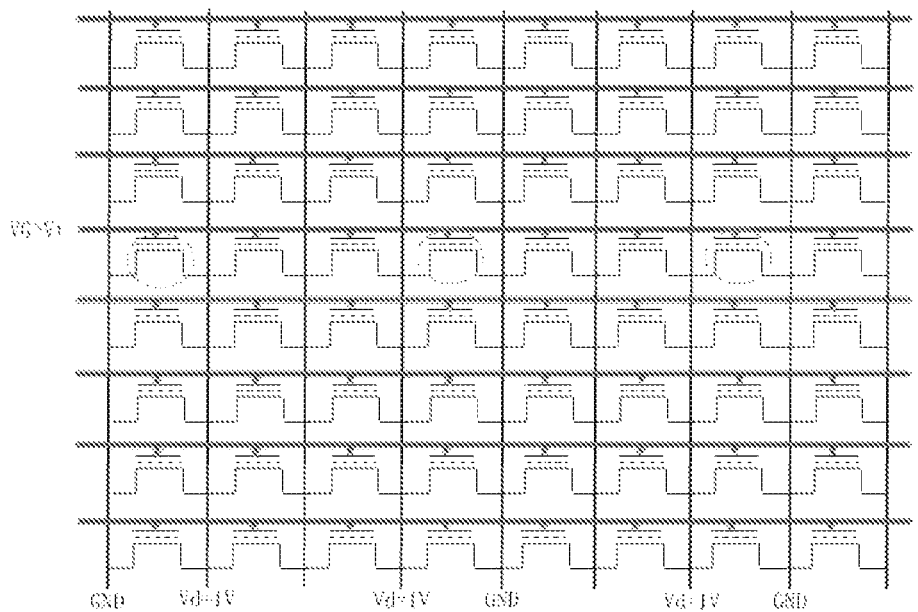
FIG. 8 is a diagram of 8×8 array structure of photosensitive detector with composite dielectric gate MOSFET structure.

The composite dielectric gate MOSFET technology in flash memory has now become a mature technology. A 1 Gb flash memory contains $10^9$ MOSFET cells. In the past ten years, people have invented many different MOSFET array architectures which can be used in this invention. For the MOSFET technology, FIG. 7 and FIG. 8 show two available array architectures.

Figure 3:
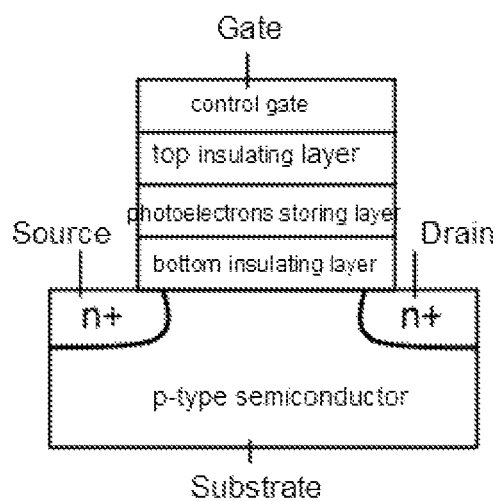
FIG. 3 is a diagrammatic sectional view of the invented detector.

As shown in FIG. 3, apply a negative voltage $V_g$ on gate and ground the substrate, then increase the negative voltage, photoelectrons tunnel out of storage layer or holes tunnel into the storage layer. So the reset can be achieved by this method. In application, allowing for the over-erase problem, the threshold voltage can approach a reference value by combining with programming FIG. 4 shows an embodiment of second dielectric layer consisted of $SiO_2/Si_3N_4/SiO_2$. In FIG. 4, for process 1 and 3, if λ>387 nm, photoelectrons move into the channel first and then tunnel into composite dielectric gate; for process 2, if λ<387 nm, photoelectrons may emit into composite dielectric gate directly. Here, $\phi_s$ denotes the voltage drop across semiconductor. The embodiments of the material and its thickness range used in the invented detector are shown in table 2.

TABLE 2

| | | gate | Top dielectric | Photoelectron storage layer | Bottom dielectric | Semiconductor layer |
|---|---|---|---|---|---|---|
| 1 | material | polysilicon | $SiO_2/Si_3N_4/SiO_2$ | polysilicon | $SiO_2$ | Si |
| | thickness | — | 12-20 nm(EOT) | 10-200 nm | 1-10 nm | — |
| 2 | material | polysilicon | $SiO_2$ | $Si_3N_4$ | $SiO_2$ | Si |
| | thickness | — | 10-20 nm | 3-10 nm | 1-10 nm | — |
| 3 | material | tungsten | $Al_2O_3$ | $Si_3N_4$ | $SiO_2$ | Si |
| | thickness | — | About 10 nm | 3-10 nm | 1-10 nm | — |
| 4 | material | polysilicon | $SiO_2$ | polysilicon | High-k($HfO_2$) | Si |
| | thickness | — | 10-20 nm | 10-200 nm | 1-5 nm | — |
| 5 | material | matel | $SiO_2$ | InGaN | AlGaN | AlGaN |
| | thickness | — | 10-100 nm | 10-200 nm | 1-100 nm | — |
| 6 | material | matel | $SiO_2/Si_3N_4/SiO_2$ | polysilicon | $SiO_2$ | SiC |
| | thickness | — | 12-20 nm(EOT) | 10-200 nm | 1-10 nm | — |

According to table 2, the specific parameter embodiments of the detector are shown in table 3.

TABLE 3

| | material | Gate polysilicon | Top dielectric $SiO_2/Al_2O_3/SiO_2$ | Photoelectron storage layer polysilicon | Bottom dielectric $SiO_2$ | Semiconductor layer Si |
|---|---|---|---|---|---|---|
| 1 | thickness | Depends on process | 5 nm/5 nm/5 nm | 100 nm | 5 nm | Depends on process |
| 2 | | | 5 nm/6 nm/5 nm | 100 nm | 5 nm | |
| 3 | | | 5 nm/7 nm/5 nm | 100 nm | 5 nm | |
| 4 | | | 5 nm/8 nm/5 nm | 100 nm | 5 nm | |
| 5 | | | 5 nm/9 nm/5 nm | 100 nm | 5 nm | |
| 6 | | | 5 nm/10 nm/5 nm | 100 nm | 5 nm | |
| 7 | | | 6 nm/7 nm/6 nm | 100 nm | 5 nm | |
| 8 | | | 7 nm/7 nm/7 nm | 100 nm | 5 nm | |
| 9 | | | 8 nm/7 nm/8 nm | 100 nm | 5 nm | |
| 10 | | | 9 nm/7 nm/9 nm | 100 nm | 5 nm | |
| 11 | | | 10 nm/7 nm/7 nm | 100 nm | 5 nm | |
| 12 | | | 5 nm/10 nm/5 nm | 100 nm | 4 nm | |
| 13 | | | 5 nm/10 nm/5 nm | 100 nm | 3 nm | |
| 14 | | | 5 nm/10 nm/5 nm | 100 nm | 2 nm | |

The embodiments in table 3 can realize the functions of the detector described in this invention. Other detector structures in table 2 can refer to the detector structure described in table 3 and 4. Because of applying the same or compatible semiconductor technology, the other detector structures illustrated in table 2 are completely available in technology fabrication. The working mechanism of them is same with the mechanism in this invention and the performance of them is similar to the embodiments in table 3 and table 4. The detailed embodiments are shown in table 4.

TABLE 4

| | material | polysilicon | $SiO_2/Si_3N_4/SiO_2$ | polysilicon | $SiO_2$ | Silicon |
|---|---|---|---|---|---|---|
| 1 | thickness | Depends on process | 10 nm/7 nm/7 nm | 80 nm | 9 nm | Depends on process |
| 2 | | | 10 nm/7 nm/7 nm | 100 nm | 9 nm | |
| 3 | | | 10 nm/7 nm/7 nm | 150 nm | 9 nm | |
| 4 | | | 10 nm/7 nm/7 nm | 200 nm | 9 nm | |
| 5 | | | 10 nm/7 nm/7 nm | 300 nm | 9 nm | |
| 6 | | | 10 nm/7 nm/7 nm | 400 nm | 9 nm | |
| 7 | | | 10 nm/7 nm/7 nm | 500 nm | 9 nm | |
| 8 | | | 10 nm/7 nm/7 nm | 600 nm | 8 nm | |
| 9 | | | 10 nm/7 nm/7 nm | 600 nm | 7 nm | |
| 10 | | | 10 nm/7 nm/7 nm | 600 nm | 6 nm | |
| 11 | | | 10 nm/7 nm/7 nm | 600 nm | 5 nm | |
| 12 | | | 10 nm/7 nm/7 nm | 600 nm | 4 nm | |
| 13 | | | 10 nm/7 nm/7 nm | 600 nm | 3 nm | |
| 14 | | | 10 nm/7 nm/7 nm | 600 nm | 2 nm | |
| 15 | | | 7 nm/6 nm/5 nm | 80 nm | 9 nm | |
| 16 | | | 7 nm/6 nm/5 nm | 100 nm | 9 nm | |
| 17 | | | 7 nm/6 nm/5 nm | 150 nm | 9 nm | |
| 18 | | | 7 nm/6 nm/5 nm | 200 nm | 9 nm | |
| 19 | | | 7 nm/6 nm/5 nm | 300 nm | 9 nm | |
| 20 | | | 7 nm/6 nm/5 nm | 400 nm | 9 nm | |
| 21 | | | 7 nm/6 nm/5 nm | 500 nm | 9 nm | |
| 22 | | | 7 nm/6 nm/5 nm | 600 nm | 8 nm | |
| 23 | | | 7 nm/6 nm/5 nm | 60 nm | 7 nm | |
| 24 | | | 7 nm/6 nm/5 nm | 600 nm | 6 nm | |

TABLE 4-continued

| material | polysilicon | SiO$_2$/Si$_3$N$_4$/SiO$_2$ | polysilicon | SiO$_2$ | Silicon |
|---|---|---|---|---|---|
| 25 | | 7 nm/6 nm/5 nm | 600 nm | 5 nm | |
| 26 | | 7 nm/6 nm/5 nm | 600 nm | 4 nm | |
| 27 | | 7 nm/6 nm/5 nm | 600 nm | 3 nm | |
| 28 | | 7 nm/6 nm/5 nm | 600 nm | 2 nm | |
| 29 | | 7 nm/7 nm/7 nm | 600 nm | 5 nm | |

Figure 5:
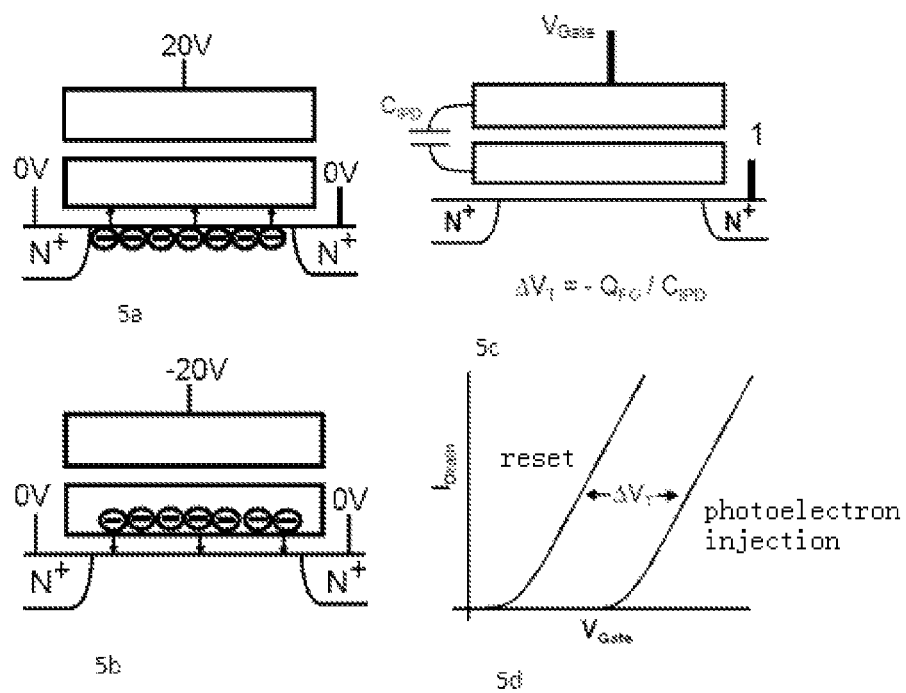
FIG. 5 is a diagram of the MOSFET output current change induced by the charge change in composite dielectric gate.

The output current of MOSFET can be changed by changing the charge quantity stored in composite dielectric gate shown in FIG. 5, where $V_{gate}=V_g$. For the embodiments described in table above, increase the gate voltage and if the gate to substrate voltage is large enough (for polysilicon/ONO/polysilicon/SiO2 structure, this value should be higher than +18V, the gate voltage of specific embodiment is up to 20V; for polysilicon/ONO/Si$_3$N$_4$/SiO$_2$ structure, this value is +12V, the photoelectrons will directly tunnel into the storage layer by F—N mechanism.

In FIG. 5a, if the gate voltage is higher than substrate voltage, the photoelectron will transfer to the interface between substrate and bottom dielectric. If the gate voltage is higher than substrate voltage and the condition (hv>Eg+ΔEc) is meet, the excitated photoelectrons can enter directly photoelectron storage layer.

FIG. 5b illustrates the photoelectron tunneling. The Photoelectron can tunnel into the photoelectron storage layer when the electric field in bottom dielectric is high enough; if the electric field in top dielectric is relatively low, the photoelectron can be stored in the storage layer.

FIG. 5c shows the structure of composite dielectric gate detector, where $\Delta V_T$ is the threshold voltage shift induced by photoelectrons tunneling into storage layer. $I_{drain}$ is the drain current, $Q_{FG}$ is the total photoelectron charge quantity stored in storage layer, $C_{IPD}$ is the capacitor between gate and storage layer, $V_{gate}$ is gate voltage. Threshold voltage shift is proportional to the charge quantity in the storage layer.

FIG. 5d shows the relationship between drain current and gate voltage. Where the left curve represents the relationship after reset and the right curve represents the relationship after the injection of photoelectrons into the storage layer. During reset, apply a negative gate voltage and ground the substrate. When the negative voltage is large enough, the photoelectrons tunnel out of the storage layer. (For polysilicon/ONO/polysilicon/SiO$_2$ structure, the value is larger than −18V; for polysilicon/ONO/Si$_3$N$_4$/SiO$_2$, the value is about −12V). ITO, metal film or semiconductor film on the substrate or gate are transparent or semi-transparent for the detection wavelength. During photoelectron collection, relatively low voltage is used to reduce the dark current: for polysilicon/ONO/polysilicon/SiO$_2$ structure, the value is larger than 10~15V; for polysilicon/ONO/Si$_3$N$_4$/SiO$_2$ structure, the value is 5~10V.

Figure 6:
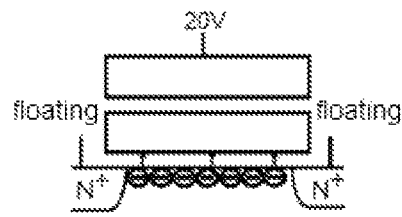
FIG. 6 is a diagram illustrating the comparison between CCD and photosensitive detector with composite dielectric gate MOSFET structure whose source and drain floating.

FIG. 6 is a diagram of changing the composite dielectric gate MOSFET into CCD with composite dielectric gate structure where source and drain are floating.

FIG. 7 shows that three composite dielectric gate MOSFETs in the third bit line are turn-on state.

FIG. 8 shows an 8×8 composite dielectric gate MOSFET array, where horizontal line is common control gate, vertical line is common source and drain, the outlined MOSFETs is being read out. This figure shows a combined structure based on the 8×8 composite dielectric gate MOSFET. Horizontal lines show the common control gate of 8 composite dielectric gate MOSFETs, vertical lines are the common source and drain, each pixel contains only one photosensitive composite dielectric gate MOSFET. When the voltage value of a common control gate is larger than the threshold voltage, the charge quantity stored in the composite dielectric gate MOSFET along this line is read out by selecting the source and drain. In FIG. 8, the first, forth and seventh MOSFET along the fourth common control gate are being read-out state. The fabricating process of this invention is fully compatible with the existing silicon semiconductor process (flash memory technology).

This invention possesses both the performance advantages of low leakage current and high fill factor of CCD and the architecture advantage of CMOS-APS. Moreover, this invention bases on modern highly mature flash memory technology, thus flash process, design and its manufacturing platform can be used directly. Each pixel can achieve ultra small size (flash cell size can reach ~80×80 nm$^2$), and pixel density can reach 100/μm$^2$ (much higher than optical resolution, ~1 micrometer); Total pixel number has a potential to exceed 1G; well capacity which is larger than 5000e-/μm$^2$ can improve the image quality of small pixel; The matching functions between imaging and electronic map can be integrated on the same chip. The response range is up to 400~1000 nm or more broad spectral bandwidth, and the well capacity is lager than 5000e-/μm$^2$; dynamic range is larger than 70 dB, dark current is smaller than 10 nA/cm$^2$, dissipation power is smaller than 100 mW.

Figure 10:
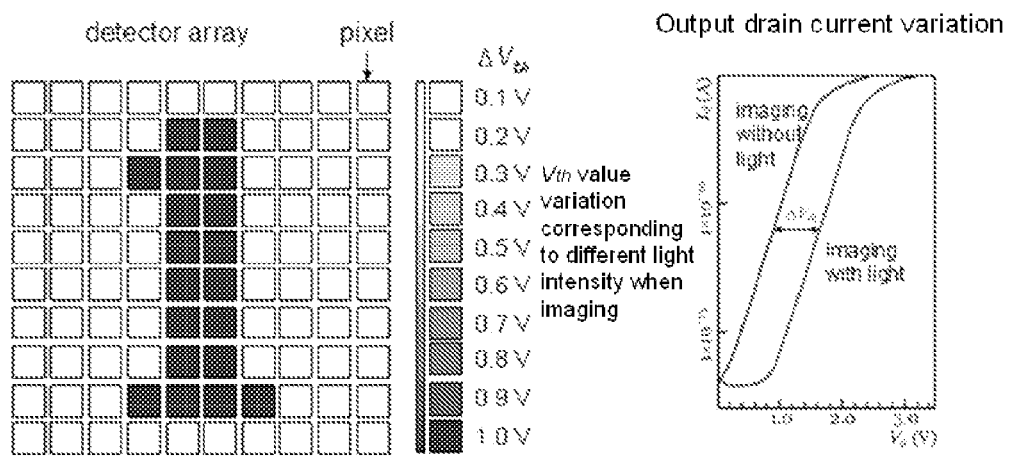
FIG. 10 is a diagram illustrating the design principle of the invented detector.

The pixel of this detector is a composite dielectric gate MOSFET. Multiple composite dielectric gate MOSFETs can form an imaging array. During imaging, photon electrons will be generated in the substrate depletion region when light incident on composite dielectric gate MOSFET, and then the generated photoelectrons will be collected and transferred into the composite dielectric gate to be stored therein, as a consequence, threshold voltage will shift relatively to the pre-exposure state. Threshold voltage shifts differently corresponding to different light intensity. The charge quantity in the storage layer can be read out by measuring the drain current variation before and after exposure in the same condition, that is, the light intensity in each pixel can be detected. In this way, when all of the pixels on the array are working at the same time, the different light intensity on each pixel can be detected and then a photo with contrast can be gained by the follow-up circuit processing. The detector pixel cell also possesses the reset function so that it can repeat imaging. FIG. 10 schematically shows the design principle of this invented detector, where $\Delta V_{th}$ represent the threshold voltage shift of each pixel corresponding to different light intensity, i.e. threshold voltage difference before and after exposure to light.

Figure 11:
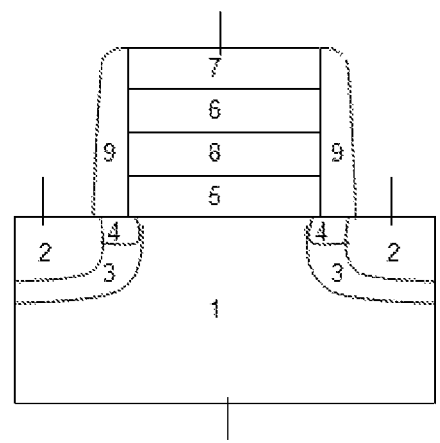
FIG. 11 is a diagrammatic sectional view of an improved structure of the photosensitive detector with composite dielectric gate MOSFET in the invention

FIG. 11 shows the improved structure of this composite dielectric gate MOSFET. Heavily doped n-type regions (2) locate on two sides of the top part of the p-type semiconductor substrate (1) to form source and drain; both the source and the drain regions close to the channel are enclosed by heavily doped p-type pockets (3); N-type LDD regions (4) as the extension of the source and the drain locate on the two sides of channel; above the top of the p-type substrate are bottom insulating dielectric material layer (5), top insulating dielectric material layer (6) and control gate (7), photoelectron storage layer (8) locates between the two insulating dielectric material layer. The described photoelectron storage layer is polysilicon, $Si_3N_4$, InGaN, metal film or other conductors and semiconductors. The control gate is polysilicon, metal or other transparency electrode materials. There are insulating spacers (9) on two sides of the control gate. The substrate or the gate surface must be transparent or semitransparent for the detecting the wavelength.

Figure 12:
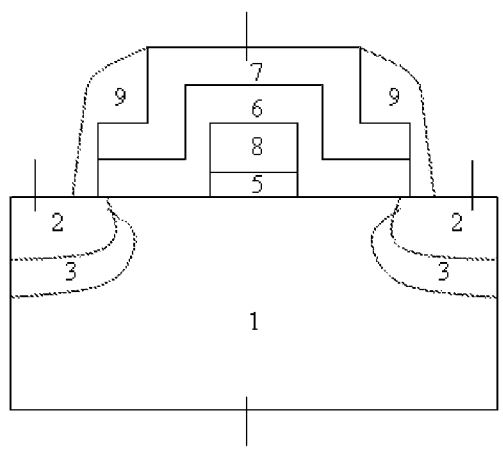
FIG. 12 is a diagrammatic sectional view of the invented detector cell based on the EJ-MOSFET structure.

The described detector can also use the structure based on EJ-MOSFET as shown in FIG. 12. Heavily doped n-type regions (2) locate on two sides of the top part of the p-type semiconductor substrate (1) to form source and drain; both the source and the drain regions close to channel are enclosed by heavily doped p-type pockets (3); above the top of the p substrate are bottom insulating dielectric material layer (5), photoelectron storage layer (8) and top insulating dielectric material layer (6). Photoelectron storage layer (8) applies a split structure. The top insulating dielectric material layer (6) isolates the photoelectron storage layer (8) from the source and the drain. The control gate (7) is above top insulating dielectric layer (6). The described photoelectron storage layer is polysilicon, $Si_3N_4$, InGaN, metal film or other conductors and semiconductors. The control gate is polysilicon, metal or other transparency electrode materials. There are insulating spacers (9) on two sides of the control gate. The substrate or the gate surface must be transparent or semitransparent for the detecting the wavelength.

Besides the above mentioned two composite dielectric gate MOSFET structures, all of other composite dielectric gate MOSFET structures used as photosensitive image device are not beyond this invention.

Figure 13:
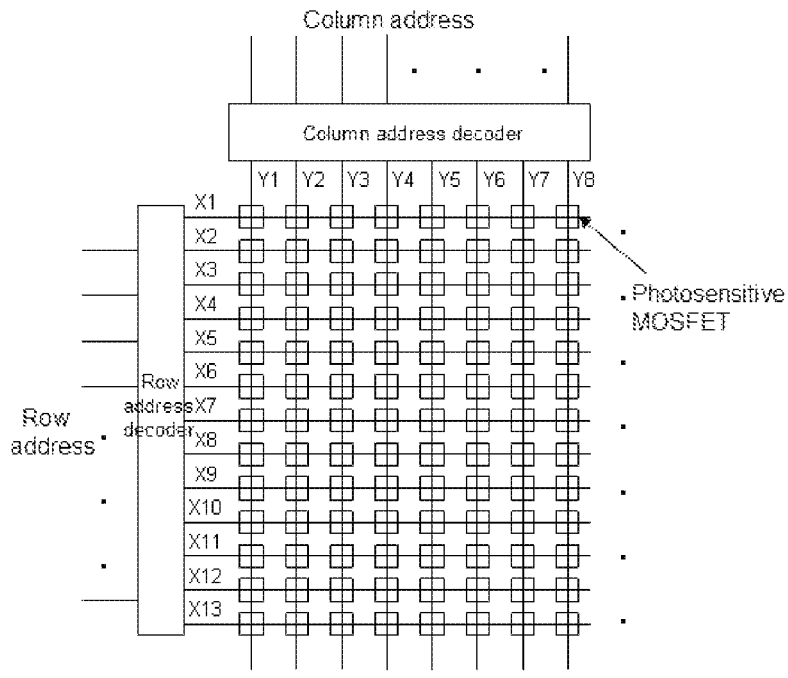
FIG. 13 is a diagram illustrating the array of the detector in the invention

Multiple composite dielectric gate MOSFETs can be arranged in array to form large area and ultra high pixel density detector. FIG. 13 schematically shows its diagram of the array. External input row and column address are decoded by decoder to generate row selecting line X and column select line Y. Only unit chosen by row and column selecting line at the same time can be operated. When the detector is imaging, all of the photosensitive units on the array are chosen to collect, transfer and store the photoelectrons at the same time. By X-Y addressing mode every unit can be separately reset, i.e. erasing and programming as well as reading out the stored photoelectrons for each photosensitive MOSFET. At present, the mature NOR, NAND or other flash structures can be applied to the detector array.

FIG. 11 shows a designed unit of composite dielectric gate MOSFET photosensitive detector. It bases on standard floating gate structure. The photoelectron storage layer uses polysilicon as floating gate which has the function of storing charge. Bottom dielectric layer is thin $SiO_2$ dielectric, through which the electrons tunnel into the floating gate when programming. Top insulating dielectric layer is $SiO_2/Si_3N_4/SiO_2$ (ONO) structure, which aims to prevent the loss of the stored electrons in storage layer from gate. Polysilicon is used as control gate, whose top is a transparent or translucent window. Heavily doped n-type regions locate on two sides of the top of the p-type semiconductor substrate to form the source and the drain. Differing from standard floating gate MOSFET, photosensitive MOSFET uses channel as the photoelectrons collecting area. In order to prevent collected photoelectrons diffusing towards the source and the drain, a heavily p-doped package is set around the source and the drain. In order to prevent the electrons from the source and the drain accompanying the collected photoelectrons tunnel into the floating gate, a lightly doped and shallow N-type LDD is formed close to the channel on two sides of the source and the drain. In addition, the overlapped area of LDD and floating gate keeps as small as possible to reduce the work dark current.

The main parameters of a designed photosensitive detector with floating gate MOSFET cell are as follows: the channel length is 0.18 μm; the channel width is 0.18 μm; the spacer thickness is 0.2 μm; the length of source and drain is 0.4 μm; the polysilicon floating gate thickness is 1000 Å; the polysilicon control gate thickness is 2000 Å; $SiO_2/Si_3N_4/SiO_2$ thickness is 50 Å/100 Å/40 Å; the bottom $SiO_2$ thickness is 100 Å.

Figure 14:
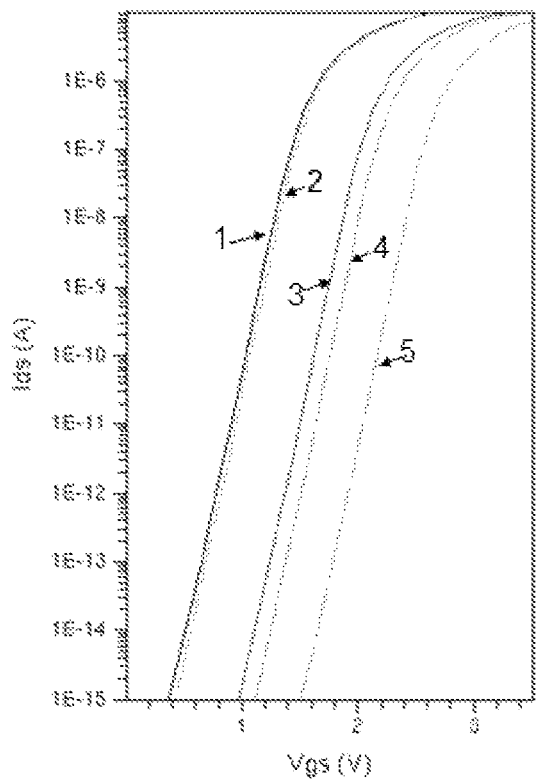
FIG. 14 is a diagram of the simulation results of photoelectric characteristics for a detector pixel in the invention.

Use TCAD device simulation tool to simulate the two-dimensional photoelectric characteristics of this photosensitive detector cell with floating gate MOSFET. FIG. 14 shows the readout current curves of photosensitive detector cell with floating gate MOSFET for four different light intensities. Curve 1 is readout drain current versus gate voltage with no incident light. Curve 2, 3, 4 and 5 are the readout drain current versus gate voltage detected for light intensity 3.5e-5, 5.0e-4, 3.0e-3, and 1.0e-2 $W/m^2$, respectively. FIG. 14 shows that the stronger the light intensity is, the more the photoelectrons collected and transferred into storage layer are. Therefore, the threshold voltage of photosensitive MOSFET increases, that is, drain current will be lower under the same bias. Comparing the readout drain current before and after exposure to light, the number of the collected photoelectrons can be obtained. The device simulation results of photoelectric characteristics prove that the principle of the composite dielectric gate MOSFET detector is feasible.

Figure 15:
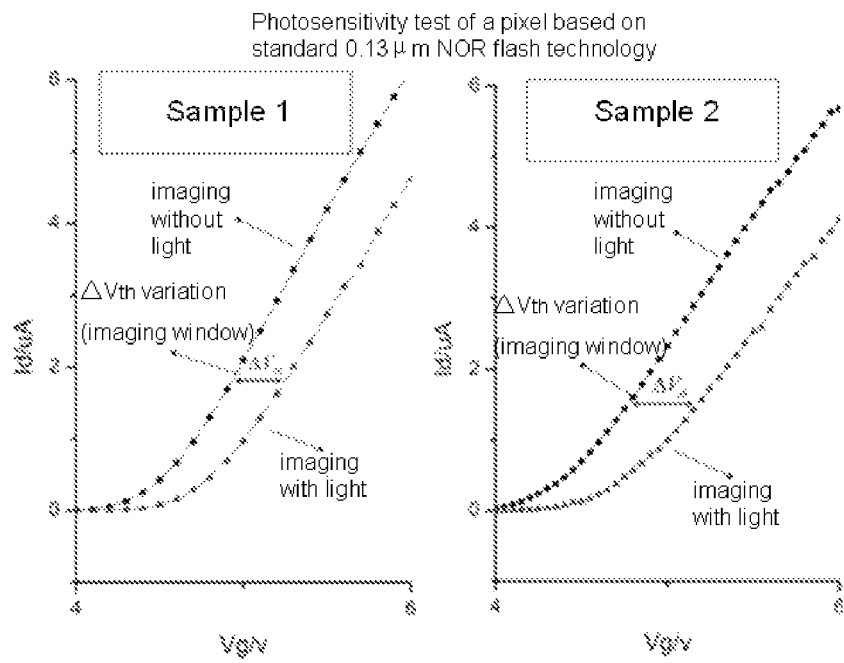
FIG. 15 is a diagram of the test results of photoelectric characteristics for a detector pixel sample in the invention.
Figure 16:
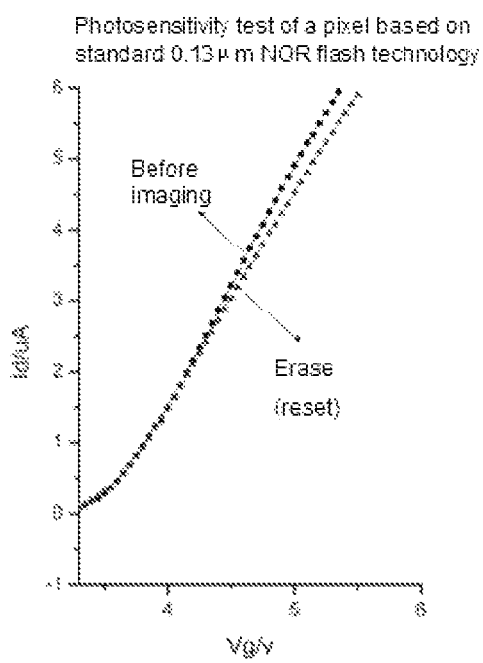
FIG. 16 is a diagram of the test results after reset for a detector pixel sample in the invention.

The tested pixel unit is based on floating gate NOR flash architecture, manufactured in standard 0.13 μm CMOS technology. The channel length and width of the MOSFET pixel unit are 0.165 μm and 0.22 μm, respectively. The thickness of bottom $SiO_2$ tunneling layer is 100 Å, the thickness of polysilicon floating gate is 1000 Å, the thickness of polysilicon control gate is 2000 Å, the thickness of top dielectric ONO is 50 Å/100 Å/40 Å. Two cells in a photosensitive MOSFET array are tested. After exposed to relatively weak light for 20 ms, threshold voltages of the two samples both increase about 0.3V, i.e. the threshold voltage difference (imaging window) is about 0.3V. FIG. 15 shows the test results of the pixel unit samples. FIG. 15(a) is the result of sample 1 and FIG. 15(b) is the result of sample 2. The samples have been reset to initial threshold voltage value and can work next time. FIG. 16 shows the test result after reset. The test results of the pixel unit fully prove the principle of composite dielectric gate MOSFET is correct. The area of the tested pixel sample is 0.169 $μm^2$, while the present smallest CCD pixel area is about 2×2 $μm^2$, which means that in the same sensitive area, the photosensitive detector can achieve 12 times higher resolution than that of CCD. In other words, to achieve the same resolution, the sensitive area of this detector is only one twelfth of the CCD. With the further scaling of composite dielectric gate MOSFET, the resolution of this detector can be greatly improved. As a result, the invented detector can possess ultra high pixel density, and improve the resolution of present imaging device to one or two orders of magnitude, which means physical resolution will be higher than optical resolution. This is incomparable superiority which CCD and CMOS APS can not achieve.

All of the invented composite dielectric gate MOSFETs in an array must be reset to adjust threshold voltage to an initial value before each imaging. When light incident on the photosensitive detector array, all of the photosensitive MOSFETs will begin to collect photoelectrons at the same time and transfer the collected photoelectrons into the composite dielectric gate to store, therefore, threshold voltage of the MOSFET will change. The number of the collected and stored photoelectrons as well as threshold voltage shift in each photosensitive MOSFET is proportional to light intensity. Therefore, by reading out the drain current change of each photosensitive MOSFET before and after exposure to light, the light intensity detected by each photosensitive MOSFET can be obtained. Through the follow-up circuit processing a complete image can be obtained after all of the cells in the array are read out according to their physical position.

The detailed working mechanism and process of the described detector based on improved composite dielectric gate MOSFET structure and the photosensitive detector based on EJ-MOSFET structure are as follows:

1) Reset

After the imaging operation of the composite dielectric gate MOSFET detector, the collected photoelectrons are transferred into composite dielectric gate. As a result, the threshold voltage of the photosensitive MOSFET increases. Before next imaging, all of composite dielectric gate MOSFET units must be reset to the vicinity of reference value by erasing the electrons in the storage layer to ensure the threshold voltage difference for each unit can be controlled in a small range. The steps of reset are as follows: the control gate of photosensitive MOSFET is applied a negative voltage $V_g$, the substrate and source are applied a positive voltage; increasing $V_g$ to force the photoelectrons tunneling out of storage layer or drive holes tunneling into the storage layer. In this way, the threshold voltage of this detector will be lowered so as to achieve the purpose of reduction. In specific application, over-erase should be taken into account. For solve the problem, channel hot electron injection (CHE) and FN tunneling programming can be combined to adjust threshold voltage. FIG. 9 shows the specific process of reset. Selecting a MOSFET with threshold value $V_{tref}$ as the reference, assuming the initial threshold voltage of a composite dielectric gate MOSFET to be reset is $V_{t0}$, applying a same voltage $V_{bias}$ and then measuring the drain current $I_{d0}$. After a series of "erase" and "programming" operation, the threshold voltage and output current of this composite dielectric gate MOSFET are $V_{ti}$ and $I_{di}$, respectively. Setting ∈ as the max current deviation of $I_{di}$ and $I_{dref}$. If current deviation is smaller than ∈, the reset of the detector is completed, if not, continue the operation of "erase" and "programming". The threshold voltage of any composite dielectric gate MOSFET of the detector can approximate the reference threshold voltage value through this reset operation.

2) Photoelectrons Collection, Transfer and Storage (1) Photoelectrons collection: the source and drain of composite dielectric gate MOSFET are floated, a positive bias pulse is applied between the gate and substrate, and then a depletion region with no electrons is formed on the surface of p-type semiconductor under the bottom dielectric, which is in a non-equilibrium state. The recovery of the thermal equilibrium state in the depletion region needs electrons injection coming from three sources: 1) in depletion region, the substrate current generating comes from deep energy level in the interface of bottom dielectric; 2) current generating comes from injected electrons in diffusion region; 3) photoelectrons generated by semiconductor absorbing the outside injected photons. Without photon injecting, it typically needs 10 ms-1 s to recover to equilibrium state. The depletion region will disappear after returning to equilibrium state. When photons inject into the depletion region, the ones whose energy are greater than energy gap will be absorbed by semiconductor, therefore, the valence band electrons in p-type semiconductor will be excited to the conduction band to generate photoelectrons. If applied gate voltage pulse width is less than the recovery time, the photoelectrons, generated by outside injected photons, will be motivated to the interface of p-substrate and bottom dielectric layer to form a charge packet by gate voltage. At this moment increasing the gate voltage immediately to generate a large enough electric field in bottom dielectric layer, then the collected photoelectrons will tunnel into the composite dielectric gate storage layer. During photoelectrons collection, a pocket implantation is used to form p+ transition regions between p-type semiconductor and n-type source as well as drain in order to prevent the collected photoelectrons leaking into the n-type source and drain. In this way, a relatively high barrier is formed between the p+ transition region and p-type substrate to prevent photoelectrons injecting into source and drain. It should be noted that during the process of photoelectrons transferring into the storage layer, the electrons from source and drain will also tunnel into storage layer to induce a large dark current. To restrain this dark current, a lightly doped n-type source and drain extension regions (LDD) are formed on the sides of the source and the drain close to the channel, and ensure that the overlap area between LDD and composite dielectric gate is relatively small. For the detector based on EJ-MOSFET structure, there is no overlap area between source, drain and photoelectrons storage layer. When the control gate is applied a high voltage pulse, the electrons from source and drain will not transfer into photoelectrons storage layer, therefore the dark current will be greatly reduced. When the EJ-MOSFET is working on read-out state, an electron inversion area will be formed between the source, the drain and the channel below the photoelectrons storage layer to serve as the extension of the source and the drain, which make the photosensitive EJ-MOSFET reading out current normally.

(2) Photoelectrons transfer: after photoelectrons collection, applying a sufficiently lager positive voltage pulse between control gate and substrate to make the electric field in the first dielectric layer strong enough, the collected photoelectrons will tunnel into the photoelectrons storage layer of composite dielectric gate. There are three mechanisms for photoelectrons tunneling into storage layer illustrated in FIG. 4. Here, for process 1, photoelectrons first move into the channel and then tunnel directly into the composite dielectric gate. For process 2, photoelectrons tunnel into the composite dielectric gate by FN mechanism, just like the programming mechanism of flash memory. For process 3, photoelectrons directly emit into composite dielectric gate just like PMT. The difference is that PMT emit electron into vacuum while the described detector emits electrons into composite dielectric gate.

(3) Photoelectrons storage: when the second dielectric layer is relatively thick, the electric field will be relatively weak so that photoelectrons will be stored in the storage layer and not transfer towards control gate. After removing the working pulse applied on the composite dielectric gate MOSFET, the photoelectrons will still be in the storage layer and not lose. Before the next work the stored photoelectrons will be erased by reset.

3) The Readout and Amplification of the Photoelectrons is the Same with above Description.

The operation condition embodiment of the invented detector is shown in table 5 and 6. Here are operation condition of photoelectrons collection and storage. The two operations are a continuous process. Table 7 is the operation condition of photoelectrons readout. Table 8 is the operation condition of erase by FN tunneling. To prevent over-erase, CHE or FN programming is used to adjust the threshold voltage of photosensitive MOSFET to the vicinity of the reference value. Table 9 and 10 is the operation conditions of reset using CHE or FN programming.

In conclusion, this invention proposes a detector using composite dielectric gate MOSFETs structure and its optical signal processing method, the array of this device can forms a high resolution imaging chip. Therefore, the detector or imaging chip using MOSFETs with other structures, materials and parameters are within the content of this invention.

TABLE 5 the operation condition of photoelectron collection

| electrode | voltage pulse | pulse width |
|---|---|---|
| gate | 5-12 V | 0.1-100 ms |
| drain | floating | N/A |
| source | floating | N/A |
| substrate | 0 V | N/A |

TABLE 6 the operation condition of photoelectron transfer and storage

| electrode | voltage pulse | pulse width |
|---|---|---|
| gate | 10-20 V | 0.1-10 µs |
| drain | floating | N/A |
| source | floating | N/A |
| substrate | −5-0 V | 0.1-10 µs |

TABLE 7 the operation condition of photoelectron readout

| electrode | voltage pulse | pulse width |
|---|---|---|
| gate | 1-6 V | 0.1-100 µs |
| drain | 0.1-0.5 V | 0.1-100 µs |
| source | 0 V | N/A |
| substrate | 0 V | N/A |

TABLE 8 the operation condition of reset by FN erasing

| electrode | voltage pulse | pulse width |
|---|---|---|
| gate | −15 V | 0.1~300 ms |
| drain | 0 V | N/A |
| source | 0 V | N/A |
| substrate | 0 V | N/A |

TABLE 9 the operation condition of CHE programming

| electrode | voltage pulse | pulse width |
|---|---|---|
| gate | 8-10 V | 0.1-30 µs |
| drain | 1-5 V | 0.1-30 µs |
| source | 0 V | NA |
| substrate | 0 V | NA |

TABLE 10 the operation condition of reset by FN programming

| electrode | voltage pulse | pulse width |
|---|---|---|
| gate | 10-20 V | 0.1-100 ms |
| drain | 0 V | N/A |
| source | 0 V | N/A |
| substrate | 0 V | N/A |

What is claimed is:

1. A photosensitive detector with a composite dielectric gate MOSFET structure comprising:
   n-type semiconductor regions located on the two sides of the top part of a p-type semiconductor substrate to form a source and a drain; a bottom dielectric layer, a photoelectron storage layer, a top dielectric layer, and a control gate stacked on the substrate in sequence;
   wherein said photoelectron storage layer is made from polysilicon, $Si_3N_4$, InGaN, metal film or other electronic conductors or semiconductors, said control gate is made from polysilicon, metal or transparent conducting electrode;
   wherein said top dielectric layer that is connected to the control gate prevents the photoelectrons stored in the photoelectron storage layer from leaking into the control gate, under low gate voltage, said bottom dielectric layer connected to the p-type substrate effectively shields the channel between the source and the drain from the photoelectron storage layer, if the gate voltage or photon energy is high enough, the electrons in the channel can be injected into the photoelectron storage layer, and while photoelectrons are collected and injected, the source and the drain should be floating;
   wherein said bottom dielectric layer is made from silicon oxide, SiON or other materials with high-k dielectrics, said top dielectric layer is made from $SiO_2/Si_3N_4/SiO_2$, $SiO_2/Al_2O_3/SiO_2$, $SiO_2$, $Al_2O_3$ or other materials with high-k dielectrics;
   wherein when the voltage difference between the gate and the substrate is high enough, the photoelectrons collected in the channel can tunnel into the photoelectron storage layer, and at least one of the substrates or the gate surface must be transparent or semitransparent for detecting a wavelength;
   an electronic means for grounding the gate and the substrates, and applying a proper positive voltage on the drain, to regulate gate voltage to ensure that a MOSFET detector works in an linear region;
   a measuring means for measuring and comparing the output drain current before and after exposure to light, to determine the optical signal strength according to the following formula:

$$\Delta I_{DS} = \frac{\mu_n C_{ox} W}{L} \cdot \frac{N_{FG} q}{C_T} \cdot V_{DS} \qquad (a)$$

where $\Delta I_{DS}$ is the detector drain current change before and after exposure to light, $N_{FC}$ is the number of photoelectrons in the photoelectron storage layer, $C_T$ is the total equivalent capacitance of the photoelectron storage layer, $C_{ox}$ is the gate oxide capacitance per unit area between photoelectron storage layer and the substrate, W and L are the detector channel width and length respectively, $\mu_n$ is the electron mobility, $V_{DS}$ is the drain to source voltage, a resetting device for applying the gate a negative voltage and grounding the substrate.

2. The photosensitive detector of claim 1, wherein the photoelectron storage layer (8) has a split structure, as the top dielectric (6) isolating the photoelectron storage layer from the source and drain, the control gate (7) is above the top dielectric, there are insulating side walls (9) on two sides of control gate, the substrate or the gate surface must be transparent or semitransparent for detecting the wavelength.

3. The photosensitive detector of claim 1, wherein the source and the drain regions close to the channel are enclosed by heavily doped p-type pockets (3), n-type LDD regions (4) as the extension of the source and the drain locate on the two sides of channel.

4. The photosensitive detector of claim 1, wherein said bottom dielectric material is selected from the group consisting of $SiO_2$ with a thickness in a range of 1-10 nm, $Si_3N_4$ with a thickness in a range of 1-10 nm, $HfO_2$, $Al_2O_3$, $ZrO_2$, $Y_2O_3$, $BaTiO_3$, $ZrSiO_4$, $Ta_2O_3$ with an equivalent oxide thickness in a range of 1-10 nm and AlGaN with a thickness in a range of 1-100 nm;

the top dielectric material is selected from a group consisting of $SiO_2/Si_3N_4/SiO_2$, its with an equivalent SiO2 thickness in a range of 12-20 nm, $SiO_2/Al_2O_3/SiO_2$ with an equivalent $SiO_2$ thickness in a range of 10-100 nm, $HfO_2$, $Al_2O_3$, $ZrO_2$, $Y_2O_3$, $BaTiO_3$, $ZrSiO_4$, $Ta_2O_3$ with an equivalent $SiO_2$ thickness in a range of 12-20 nm and AlGaN with a thickness in a range of 1-100 nm;

the photoelectron storage layer material is selected of a group consisting of polysilicon with a thickness in a range of 10-200 nm, $Si_3N_4$ with a thickness in a range of 3-10 nm, and InGaN with a thickness in a range of 10-200 nm;

the control gate material is selected from a group consisting of polysilicon with a thickness in a range of 10-200 nm, ITO with a thickness in a range of 3-10 nm, metal and transparent electrode.

5. The photosensitive detector of claim 1, wherein said composite dielectric gate MOSFET structure is of an array of detector units.

6. The photosensitive detector of claim 1, wherein the bottom insulating dielectric is of $SiO_2$ with a thickness in a range of 1-10 nm; the top insulating dielectric is of $SiO_2/Si_3N_4/SiO_2$ or $SiO_2/Al_2O_3/SiO_2$ with an equivalent $SiO_2$ thickness in a range of 12-20 nm, the photoelectron storage layer material is of poly silicon with a thickness in range of 10-200 nm, and the control gate material is of poly silicon.

7. The photosensitive detector of claim 1, wherein said bottom insulating dielectric is of $SiO_2$ with a thickness in range of 1-10 nm; the top insulating dielectric is of $SiO_2$ with a thickness in range of 10-20 nm, the photoelectron storage layer material is of $Si_3N_4$ with a thickness in a range of 10-20 nm, and the control gate material is of poly silicon.

8. The photosensitive detector of claim 1, wherein said control gate is of Tungsten, the top insulating dielectric is of $Al_2O_3$ with a thickness of 10 nm, the photoelectron storage layer material is of $Si_3N_4$ with a thickness in a range of 3-10 nm, and the bottom insulating dielectric is of $SiO_2$ with a thickness in a range of 1-10 nm.

9. The photosensitive detector of claim 1, wherein said control gate is of poly silicon, the top insulating dielectric is of $SiO_2$ with a thickness in a range of 10-20 nm, the photoelectron storage layer material is of poly silicon with a thickness in a range of 1-200 nm, and the bottom insulating dielectric is of high-k dielectric material with an equivalent $SiO_2$ thickness in a range of 1-5 nm.

10. The photosensitive detector of claim 1, wherein said control gate is of metal, the top insulating dielectric is of $SiO_2$ with a thickness in a range of 10-100 nm, the photoelectron storage layer material is of InGaN with a thickness in a range of 10-200 nm, the bottom insulating dielectric is of AlGaN with a thickness in a range of 1-100 nm, and the substrate material is of AlGaN.

11. The photosensitive detector of claim 1, wherein the control gate is of metal, the top insulating dielectric is of $SiO_2/Si_3N_4/SiO_2$ or $SiO_2/Al_2O_3/SiO_2$ with an equivalent oxide thickness in a rage of 12-20 nm, the photoelectron storage layer material is of poly silicon with a thickness in a range of 10-200 nm, the bottom insulating dielectric uses is of $SiO_2$ with a thickness in a range of 1-10 nm, and the substrate material is of SiC.

12. A signal readout method for photosensitive detector comprising following steps:

the photosensitive detector with a composite dielectric gate MOSFET structure including n-type semiconductor regions located on two sides of a top part of a p-type semiconductor substrate to form a source and a drain, a bottom dielectric layer, a photoelectron storage layer, a top dielectric layer, and a control gate stacked on the substrate in sequence, wherein said photoelectron storage layer is made by material selected from a group consisting of polysilicon, $Si_3N_4$, InGaN, metal film, electronic conductors and semiconductors, said control gate is made by a material selected from a group consisting of polysilicon, metal and transparent conducting electrode;

a step of photoelectron readout and amplification, which is to ground the source and the substrate, and apply a proper positive voltage to the drain, then regulate the gate voltage to ensure that the MOSFET detector work in a linear region, and by directly measuring and comparing the output drain currents before and after exposure, the optical signal strength can be determined; the relationship between the change of the drain current and the number of collected photoelectrons is as follows:

$$\Delta I_{DS} = \frac{\mu_n C_{ox} W}{L} \cdot \frac{N_{FG} q}{C_T} \cdot V_{DS} \qquad (a)$$

wherein $\Delta I_{DS}$ is the change of the drain current before and after exposure, $N_{FC}$ is the number of photoelectrons in the photoelectron storage layer, $C_T$ is the total equivalent capacitance of the photoelectron storage layer, $C_{ox}$ is the gate oxide capacitance per unit area between the photoelectron storage layer and the substrate, W and L are the detector channel width and length respectively, $\mu_n$ is the electron mobility, $V_{DS}$ is the voltage difference between the drain and the source; and a step of reset, which is to apply a negative voltage to the gate and ground the substrate, and if the negative voltage is high enough, the photoelectrons in the photoelectron storage layer will tunnel into the p-type substrate.

13. The signal readout method of claim 12, wherein readings of the number of photoelectrons are taken before and after exposure in order to accurately record the number of collected photoelectrons:

before the exposure, apply two different control gate voltages $V_{CG1}$ and $V_{CG2}$ respectively, then measure the drain currents $I_{DS1}$ and $I_{DS2}$, and the transconductance before exposure is obtained through the following equation:

$$\beta_1^{CG} = \frac{C_{CG}}{C_T} \cdot \frac{C_{ox}\mu_n W}{L} = \frac{\Delta I_{DS}}{\Delta V_{CG} \cdot V_{DS}} \quad (b)$$

wherein $\mu_n$ is the electron mobility before exposure, $C_{CG}$ is the top dielectric layer capacitance, $V_{DS}$ is the voltage difference between the drain to the source, $\Delta V_{CG} = V_{CG2} - V_{CG1}$, $\Delta I_{DS} = I_{DS2} - I_{DS1}$;

after the exposure, in order to compensate the electron mobility drift, also apply two different control gate voltages $V_{CG1}$ and $V_{CG2}$ respectively, then measure the drain currents $I^*_{DS1}$ and $I^*_{DS2}$, and the transconductance after exposure is obtained through the following equation:

$$\beta_2^{CG} = \frac{\Delta I^*_{DS}}{\Delta V_{CG} \cdot V_{DS}} = \frac{C_{CG}}{C_T} \cdot \frac{C_{ox}\mu^*_n W}{L} \quad (c)$$

wherein $\mu^*_n$ is the electron mobility after exposure, $\Delta V_{CG} = V_{CG2} - V_{CG1}$, $\Delta I^*_{DS} = I^*_{DS2} - I^*_{DS1}$; finally, the charge quantity variation in the gate before and after exposure is obtained in terms of drain currents $I_{DS1}$ and $I^*_{DS1}$ under gate voltage $V_{CG1}$ through the following equation:

$$\Delta Q_{FG} = \left( \frac{I^*_{DS1}}{\beta_2^{CG} \cdot V_{DS}} - \frac{I_{DS1}}{\beta_1^{CG} \cdot V_{DS}} \right) \cdot C_{CG} \quad (d)$$

the number of collected photoelectrons after exposure can be calculated accurately from equation (d), as a result, the error caused by electron mobility drift is compensated.

14. The signal readout method of claim 12, wherein said method includes steps of collecting and storing photoelectrons before the signal is read out and amplified wherein:

firstly, applying a positive pulse voltage to the gate, so that an electron depletion region is formed in the p-type substrate, then when the incident photons are absorbed in the depletion region, photoelectrons will be generated, and driven by the gate voltage, the generated photoelectrons drift to the interface between a channel separating the source and the drain and a bottom dielectric layer; secondly, increasing the gate voltage to high enough, the photoelectrons will tunnel into a photoelectron storage layer by F-N tunneling mechanism; If photon energy HV of incident light is higher than conduction band energy difference $\Delta E_C$ between the substrate and the bottom dielectric layer, the photoelectrons will directly tunnel into the electron storage layer; while collecting photoelectrons, the source and the drain should be floating to prevent the electrons from tunneling into the storage layer; finally, after the collected photoelectrons are stored in the storage layer, the threshold voltage of the detector will drift, namely the drain current drift, and by measuring the drain current drifts before and after exposure, the number of photoelectrons in the storage layer can be determined.

\* \* \* \* \*